United States Patent
Sato

(10) Patent No.: US 12,382,765 B2
(45) Date of Patent: Aug. 5, 2025

(54) LIGHT-EMITTING MODULE AND METHOD FOR MANUFACTURING LIGHT-EMITTING MODULE

(71) Applicant: NICHIA CORPORATION, Anan (JP)

(72) Inventor: Kosuke Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 393 days.

(21) Appl. No.: 18/060,076

(22) Filed: Nov. 30, 2022

(65) Prior Publication Data
US 2023/0207762 A1 Jun. 29, 2023

(30) Foreign Application Priority Data
Dec. 24, 2021 (JP) .................. 2021-210759

(51) Int. Cl.
*H10H 20/857* (2025.01)
*H10H 20/01* (2025.01)
*H10H 20/831* (2025.01)

(52) U.S. Cl.
CPC .......... *H10H 20/857* (2025.01); *H10H 20/01* (2025.01); *H10H 20/8312* (2025.01); *H10H 20/032* (2025.01); *H10H 20/0364* (2025.01)

(58) Field of Classification Search
CPC .... H10H 20/857; H10H 20/01; H10H 20/032; H10H 20/0364; H10H 20/831
See application file for complete search history.

(56) References Cited

U.S. PATENT DOCUMENTS

| | | | |
|---|---|---|---|
| 6,077,765 A | 6/2000 | Naya | |
| 9,559,279 B1 | 1/2017 | Tomizawa et al. | |
| 2003/0111727 A1 | 6/2003 | Kurusu | |
| 2004/0256631 A1 | 12/2004 | Shin | |
| 2005/0104220 A1 | 5/2005 | Tsuchiya et al. | |
| 2005/0168992 A1 | 8/2005 | Hirose | |
| 2008/0310854 A1 | 12/2008 | Takai et al. | |
| 2011/0266039 A1 | 11/2011 | Tomoda | |
| 2012/0169786 A1 | 7/2012 | Okuyama et al. | |
| 2013/0264600 A1 | 10/2013 | Lee et al. | |
| 2014/0008691 A1 | 1/2014 | Tomoda et al. | |

(Continued)

FOREIGN PATENT DOCUMENTS

| JP | S63-122248 A | 5/1988 |
|---|---|---|
| JP | H04-217323 A | 8/1992 |

(Continued)

OTHER PUBLICATIONS

Non-Final Office Action in U.S. Appl. No. 17/834,571 dated Dec. 17, 2024.

*Primary Examiner* — Tucker J Wright
(74) *Attorney, Agent, or Firm* — Foley & Lardner LLP

(57) ABSTRACT

A method for manufacturing a light-emitting module includes: providing a wiring substrate including: a base member having an upper surface, and a metal layer disposed on the upper surface of the base member; forming a resist layer on the wiring substrate such that the metal layer is exposed from the resist layer; disposing an intermediate body on the resist layer, the intermediate body comprising a light-emitting element and a covering layer; forming a bonding member; removing the resist layer and the covering layer; and forming a plating layer on a surface of the bonding member by plating, such that a portion of the plating layer is located between an electrode surface of the light-emitting element and the bonding member.

11 Claims, 12 Drawing Sheets

(56) References Cited

U.S. PATENT DOCUMENTS

| | | |
|---|---|---|
| 2015/0162292 A1 | 6/2015 | Machida |
| 2015/0171281 A1 | 6/2015 | Nakabayashi et al. |
| 2016/0218262 A1 | 7/2016 | Aketa et al. |
| 2017/0098740 A1 | 4/2017 | Ohmae et al. |
| 2017/0279019 A1 | 9/2017 | Ueda et al. |
| 2020/0302835 A1 | 9/2020 | Ohmae et al. |
| 2020/0343408 A1 | 10/2020 | Sakamaki |
| 2023/0207762 A1 | 6/2023 | Sato |

FOREIGN PATENT DOCUMENTS

| | | |
|---|---|---|
| JP | H07-183304 A | 7/1995 |
| JP | H07-273117 A | 10/1995 |
| JP | H07-335648 A | 12/1995 |
| JP | H08-148531 A | 6/1996 |
| JP | H09-275108 A | 10/1997 |
| JP | H10-125685 A | 5/1998 |
| JP | 2001-044498 A | 2/2001 |
| JP | 2005-019939 A | 1/2005 |
| JP | 2006-140247 A | 6/2006 |
| JP | 2008-124376 A | 5/2008 |
| JP | 2011-233733 A | 11/2011 |
| JP | 2012-142489 A | 7/2012 |
| JP | 2014-013818 A | 1/2014 |
| JP | 2015-073060 A | 4/2015 |
| JP | 2015-195244 A | 11/2015 |
| JP | 2015-207754 A | 11/2015 |
| JP | 2016-127255 A | 7/2016 |
| JP | 2017-041612 A | 2/2017 |
| JP | 2017-183458 A | 10/2017 |
| JP | 2021-103774 A | 7/2021 |
| WO | WO-2021/132392 A1 | 7/2021 |

LIGHT-EMITTING MODULE AND METHOD FOR MANUFACTURING LIGHT-EMITTING MODULE

CROSS-REFERENCE TO RELATED APPLICATION

This application claims priority to Japanese Patent Application No. 2021-210759, filed on Dec. 24, 2021, the disclosure of which is hereby incorporated by reference in its entirety.

BACKGROUND

The present disclosure relates to a light-emitting module and a method for manufacturing the light-emitting module.

A light-emitting module including a large number of light-emitting elements mounted on a wiring substrate has been developed. For example, Japanese Patent Publication No. 1992-217323 discloses a method for manufacturing an electrode for connecting a semiconductor device chip to the outside.

SUMMARY

It is an object of the present disclosure to provide a highly reliable light-emitting module and a method for manufacturing such a light-emitting module.

A method for manufacturing a light-emitting module according to an embodiment of the present invention includes providing a wiring substrate comprising a base member having an upper surface, and a metal layer on the upper surface of the base member, forming a resist layer on the wiring substrate such that the metal layer is exposed from the resist layer, disposing an intermediate body on the resist layer, the intermediate body including a light-emitting element and a covering layer, the light-emitting element including a light-emitting surface and an electrode surface located opposite to the light-emitting surface and having an electrode disposed on a portion of the electrode surface, the covering layer covering a portion of the electrode surface located around the electrode, such that the electrode faces the metal layer, forming, by plating, a bonding member by growing the bonding member starting from the metal layer in a manner that the bonding member is in contact with the electrode and the covering layer, removing the resist layer and the covering layer, and forming a plating layer on a surface of the bonding member by plating. The plating layer is disposed between the electrode surface of the light-emitting element and the bonding member.

A light-emitting module according to the embodiment of the present invention includes a wiring substrate comprising a base member having an upper surface, and a metal layer on the upper surface of the base member, a light-emitting element including a light-emitting surface, an electrode surface located opposite to the light-emitting surface and having an electrode disposed on the electrode surface, and a lateral surface located between the light-emitting surface and the electrode surface, the electrode being disposed above the wiring substrate in a manner that the electrode faces the metal layer, a bonding member that bonds the metal layer and the electrode, and a plating layer that covers a surface of the bonding member. The bonding member includes a base portion located between the metal layer and the electrode, and an extending portion extending upward from the base portion and separated from and facing the lateral surface. The plating layer is disposed between the extending portion and the lateral surfaces.

According to the embodiment of the present disclosure, it is possible to implement a highly reliable light-emitting module and a method for manufacturing such a light-emitting module.

DETAILED DESCRIPTION

Figure 1A:
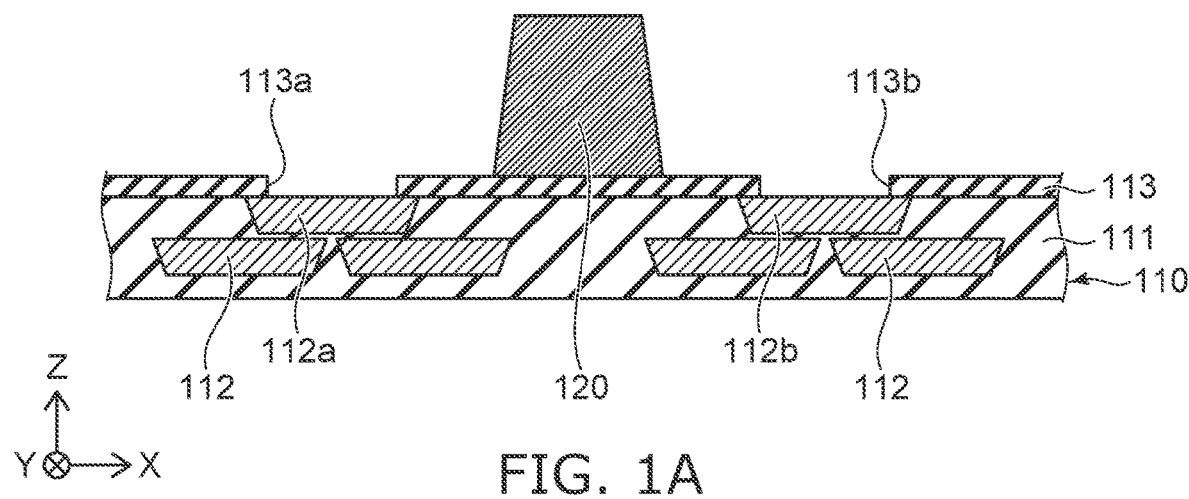
FIG. 1A is a cross-sectional view illustrating a method for manufacturing a light-emitting module according to a first embodiment.

Embodiments will be described below with reference to the accompanying drawings. Note that the drawings are schematic or conceptual, and the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated. The same reference characters denote equivalent elements throughout the present specification and drawings, and a repeated detailed description thereof may be omitted as appropriate. End surfaces may be illustrated as cross-sections.

For clarity of explanation, the arrangement and structure of respective portions will be described using the XYZ orthogonal coordinate system in the following description. The X, Y, and Z-axes are orthogonal to each other. The direction in which the X-axis extends is referred to as the "X-direction," the direction in which the Y-axis extends as the "Y-direction," and the direction in which the Z-axis extends as the "Z-direction." For clarity of explanation, in the Z-direction, the direction of the arrow is referred to as the "upward direction," and the direction opposite thereto is referred to as the "downward direction," but these are relative directions and have no relation to the gravitational direction. Furthermore, viewing the target member from above or below is referred to as "plan view." In the X-direction, the direction of the arrow is also referred to as the "+X-direction," and the direction opposite thereto is also referred to as the "−X-direction." Similarly, in the Y-direction, the direction of the arrow is also referred to as the "+Y-direction," and the direction opposite thereto is also referred to as the "−Y-direction."

First Embodiment

A description will be given for a first embodiment.

Figure 1B:
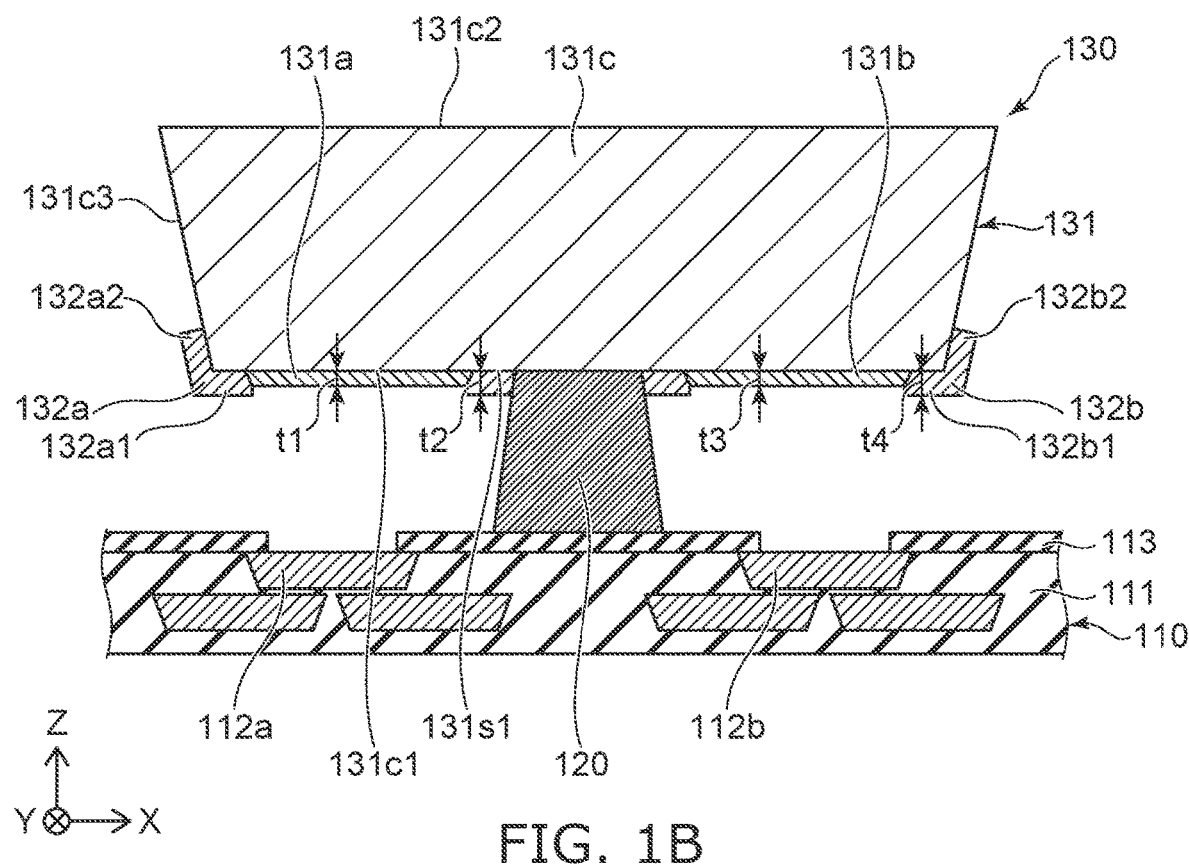
FIG. 1B is a cross-sectional view illustrating the method for manufacturing the light-emitting module according to the first embodiment.

FIGS. 1A and 1B are cross-sectional views illustrating a method for manufacturing a light-emitting module according to the present embodiment.

Figure 2:
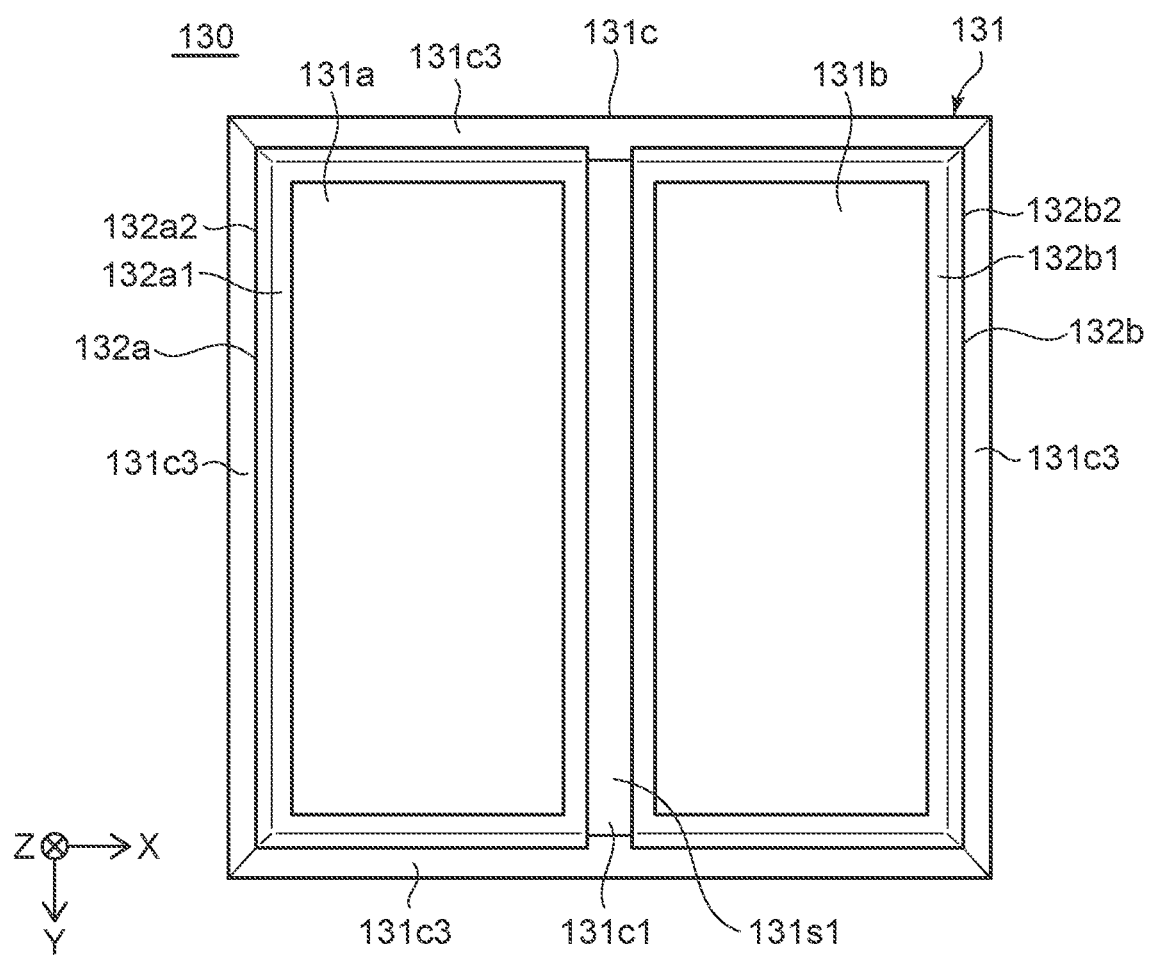
FIG. 2 is a bottom view of an intermediate body illustrated in FIG. 1B.

FIG. 2 is a bottom view of an intermediate body illustrated in FIG. 1B.

FIGS. 3A to 7 are cross-sectional views illustrating the method for manufacturing the light-emitting module according to the present embodiment.

Figure 8:
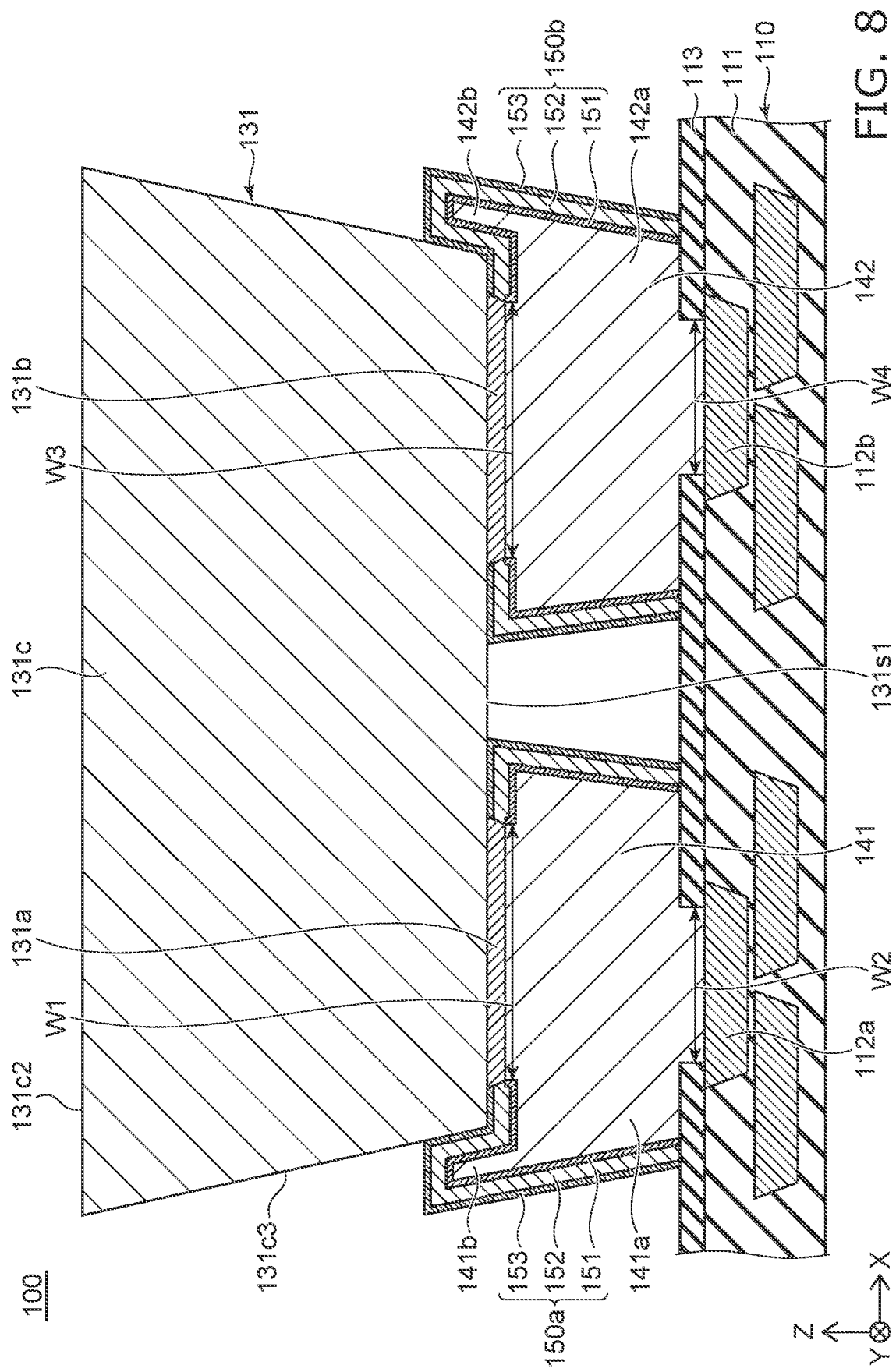
FIG. 8 is a cross-sectional view illustrating the light-emitting module according to the first embodiment.

FIG. 8 is a cross-sectional view illustrating the light-emitting module according to the present embodiment.

Figure 3A:
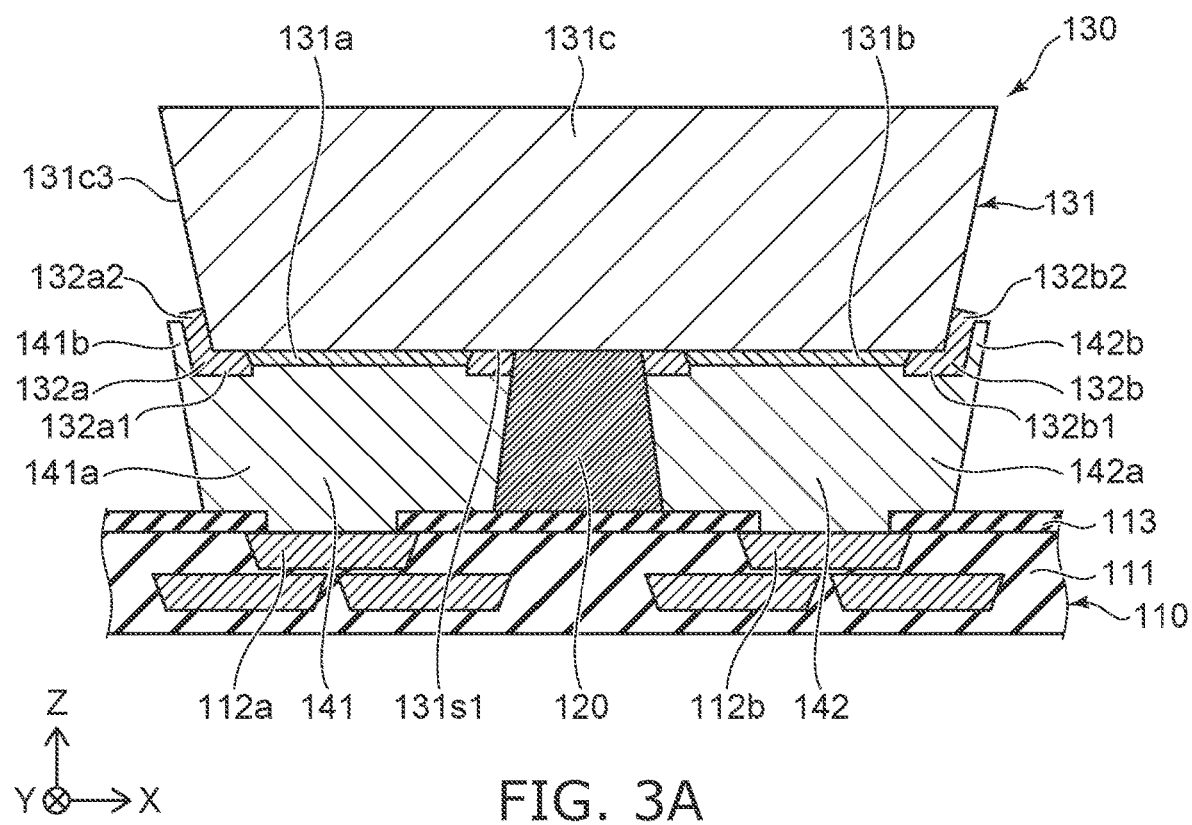
FIG. 3A is a cross-sectional view illustrating the method for manufacturing the light-emitting module according to the first embodiment.
Figure 3B:
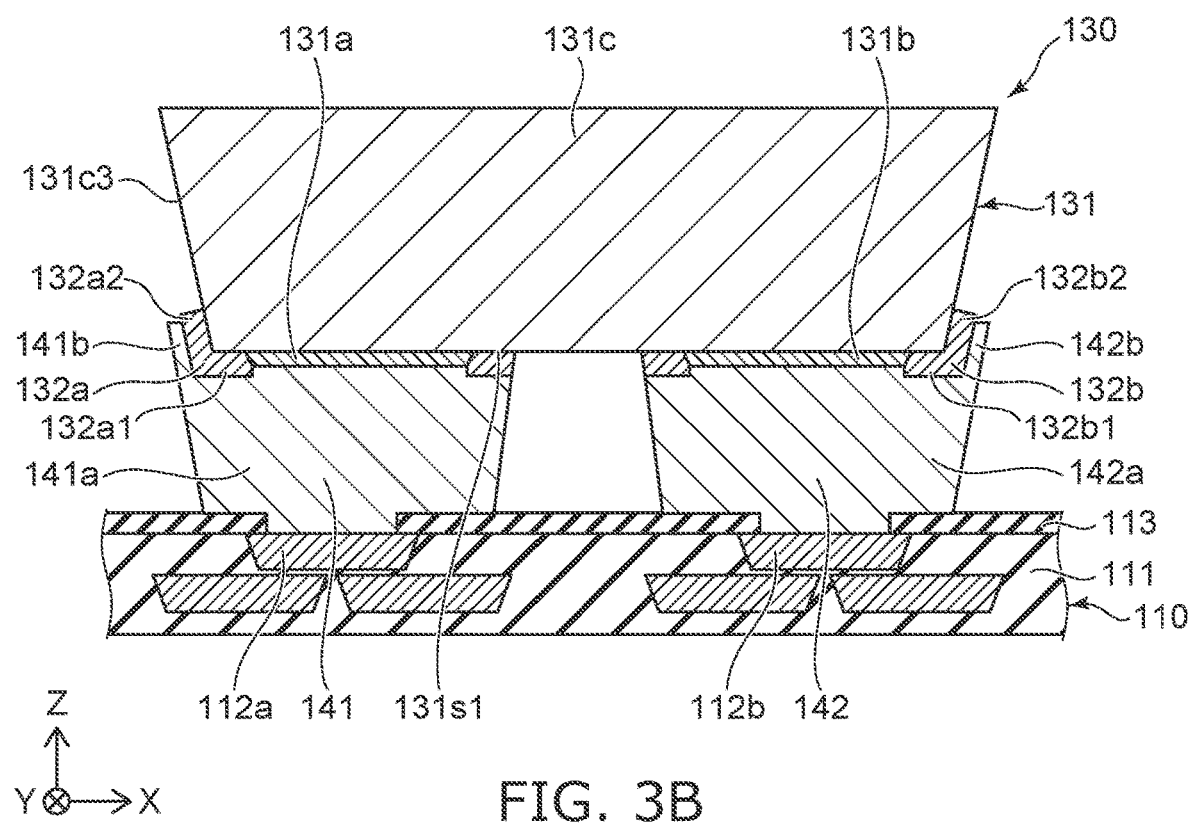
FIG. 3B is a cross-sectional view illustrating the method for manufacturing the light-emitting module according to the first embodiment.
Figure 4A:
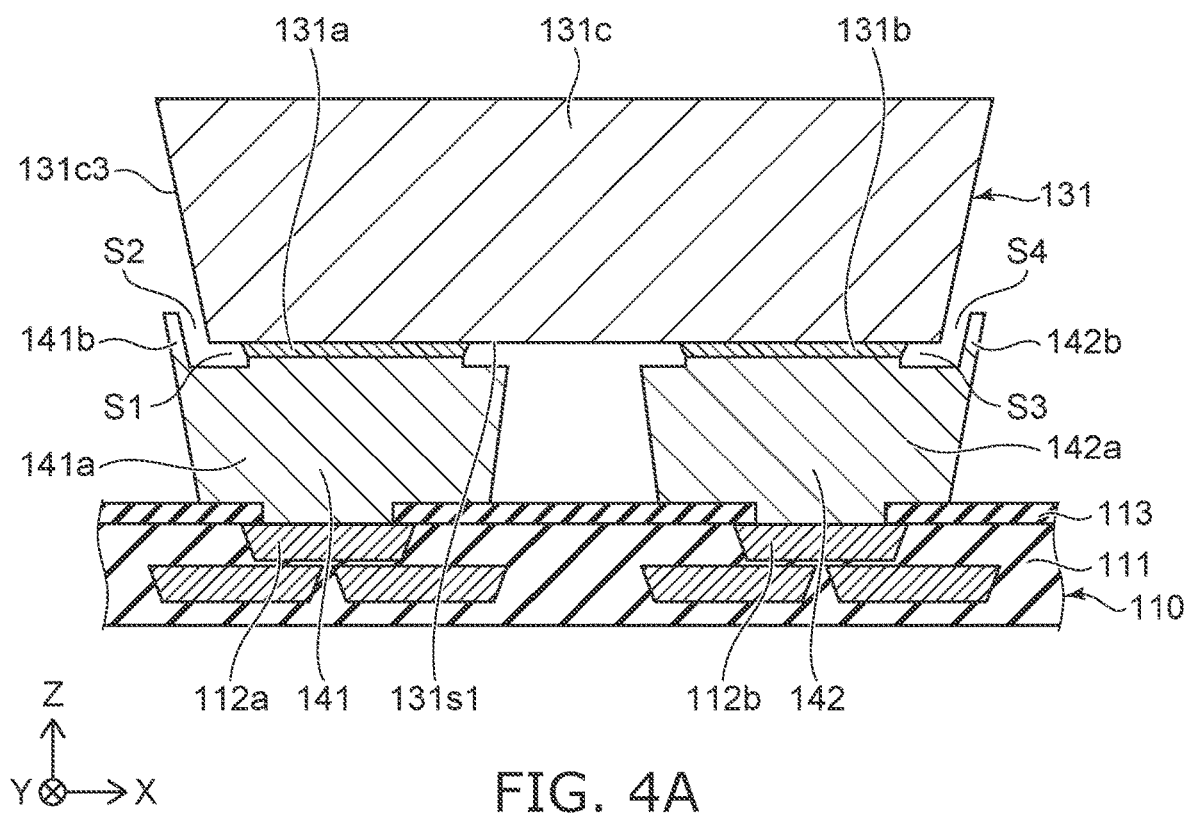
FIG. 4A is a cross-sectional view illustrating the method for manufacturing the light-emitting module according to the first embodiment.
Figure 4B:
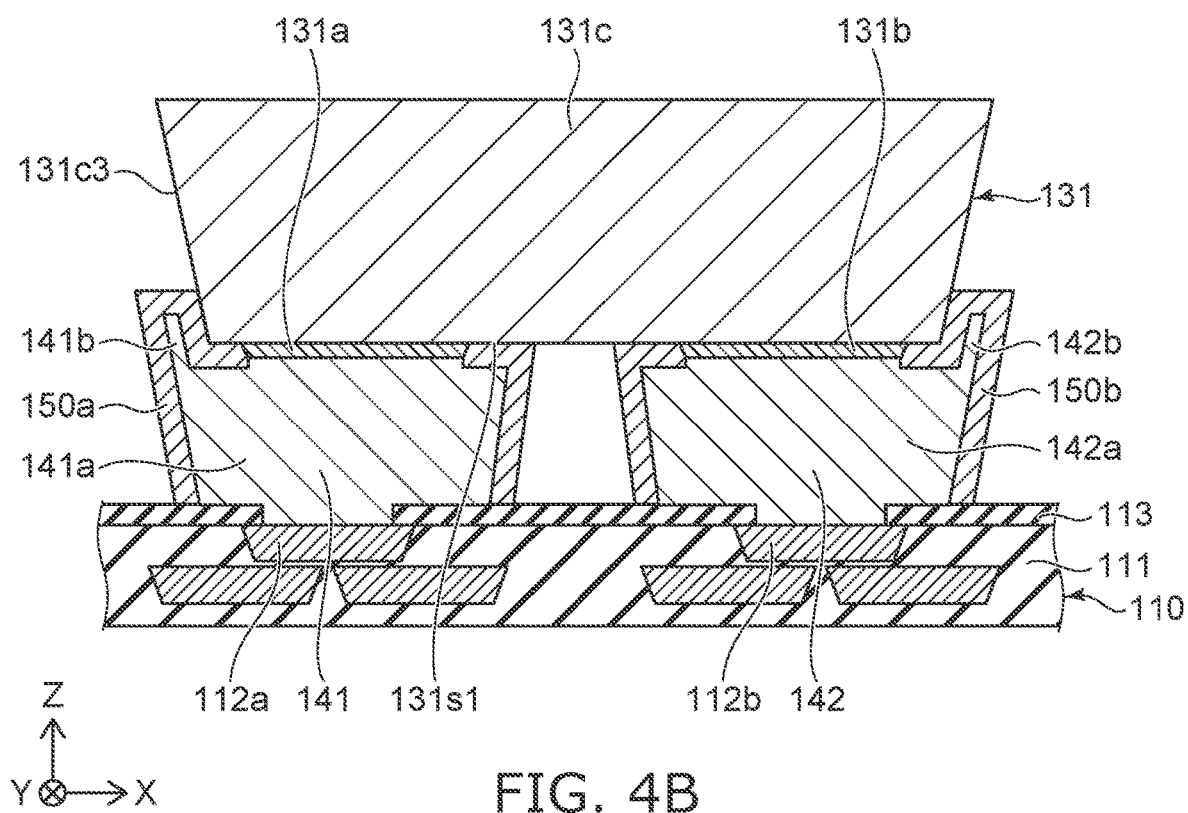
FIG. 4B is a cross-sectional view illustrating the method for manufacturing the light-emitting module according to the first embodiment.

A method for manufacturing a light-emitting module 100 according to the present embodiment includes:

providing a wiring substrate 110, forming a resist layer 120 on the wiring substrate 110 as illustrated in FIG. 1A, disposing an intermediate body 130 including a light-emitting element 131, a first covering layer 132a, and a second covering layer 132b on the resist layer 120 as illustrated in FIG. 1B, forming a first bonding member 141 and a second bonding member 142 by plating as illustrated in FIG. 3A, removing the resist layer 120, the first covering layer 132a, and the second covering layer 132b as illustrated in FIGS. 3B and 4A, and forming a first plating layer 150a on a surface of the first bonding member 141 by plating and forming a second plating layer 150b on a surface of the second bonding member 142 as illustrated in FIG. 4B.

Each process step will be described in detail below. In the following description, an example in which a single light-emitting element 131 is mounted on the wiring substrate 110 is mainly described. Alternatively, a plurality of light-emitting elements 131 may be mounted on the wiring substrate 110. The plurality of light-emitting elements 131 is disposed, for example, on square grid points, triangular grid points, or hexagonal grid points. In a case in which the plurality of light-emitting elements 131 is mounted on the wiring substrate 110, the number and positions of each element described below can be adjusted depending on the number and positions of the plurality of light-emitting elements 131.

First, the wiring substrate 110 is provided.

The wiring substrate 110 includes an insulating base member 111, a plurality of metal layers 112, and an insulating film 113. The wiring substrate 110 is, for example, an application specific integrated circuit (ASIC) substrate. The upper and lower surfaces of the base member 111 are substantially flat and substantially parallel to the X-Y plane.

The plurality of the metal layers 112 is, for example, wirings of the wiring substrate 110. The plurality of metal layers 112 is disposed in a multi-layered manner on the base member 111, for example. Two of the plurality of the metal layers 112 are disposed such that these two metal layers are aligned at least partially in the X-direction and the upper surfaces thereof are substantially flush with the upper surface of the base member 111. Hereinafter, one of these two metal layers 112 is also referred to as a "first metal layer 112a", and the other is also referred to as a "second metal layer 112b".

Each metal layer 112 can be made of at least one type of metal selected from, for example, copper (Cu), tungsten (W), nickel (Ni), silver (Ag), gold (Au), palladium (Pd), platinum (Pt), or the like, or an alloy including one or more types of these metals. Preferably, copper is used in terms of heat dissipation.

The insulating film 113 is disposed on the upper surface of the base member 111. The insulating film 113 has a first opening 113a and a second opening 113b each penetrating through the insulating film 113. The first and second openings 113a and 113b are aligned in the X-direction, for example. The first opening 113a is located immediately above the first metal layer 112a. At least a portion of the first metal layer 112a is exposed at the first opening 113a. The second opening 113b is located immediately above the second metal layer 112b. At least a portion of the second metal layer 112b is exposed at the second opening 113b. The insulating film 113 covers a portion between the first metal layer 112a and the second metal layer 112b on the upper surface of the base member 111. The shape of the first and second openings 113a and 113b in top view is not limited to the above. The shape of the first and second openings 113a and 113b in top view can be, for example, circular, elliptical, oval, rectangular with rounded corners, or rectangular.

The structure of the wiring substrate needs to have the metal layer on the upper surface and is not limited to the above. As used herein, "to have the metal layer on the upper surface" means that at least a portion of the metal layer is exposed on the upper surface of the wiring substrate. Thus, as described above, the metal layer needs to be exposed at least partially on the upper surface of the wiring substrate, and may be disposed in or on the base member or on the insulating film.

Subsequently, as illustrated in FIG. 1A, the resist layer 120 is formed on the wiring substrate 110.

The resist layer 120 is formed by, for example, photolithography. The resist layer 120 is formed, for example, on the insulating film 113, and is formed between the first metal layer 112a and the second metal layer 112b adjacent to each other at least in a plan view. The upper surface of the resist layer 120 is substantially flat and is substantially parallel to the X-Y plane. As long as the resist layer can support the light-emitting element and does not interfere with the formation of the first and second bonding members which will be described later, but the position at which the resist layer is formed is not limited to the above.

Subsequently, the intermediate body 130 is disposed on the resist layer 120, as illustrated in FIG. 1B.

The intermediate body 130 includes the light-emitting element 131, the first covering layer 132a, and the second covering layer 132b.

The light-emitting element 131 is, for example, a light-emitting diode (LED). The light-emitting element 131 includes a first electrode 131a, a second electrode 131b, and a semiconductor structure 131c. The semiconductor structure 131c includes an n-type semiconductor layer, an active layer, and a p-type semiconductor layer. The semiconductor structure 131c may further include a substrate for growing these semiconductor layers.

The semiconductor structure 131c emits blue light, for example. The n-type semiconductor layer, the active layer, and the p-type semiconductor layer in the semiconductor structure 131c are made of, for example, a nitride-based semiconductor ($In_xAl_yGa_{1-x-y}N$, $0 \le X$, $0 \le Y$, $X+Y \le 1$). Alternatively, the color of the light emitted from the semiconductor structure may be other colors such as green, red, or the like. When the plurality of light-emitting elements is mounted on the wiring substrate, the colors of light emitted from the plurality of light-emitting elements may be the same or different.

The shape of the semiconductor structure 131c is a frustum of a square pyramid. Alternatively, the shape of the semiconductor structure may be other shapes such as a polygonal frustum, a polygonal column, or the like. The surface of the semiconductor structure 131c includes a lower surface 131c1 and an upper surface 131c2 located opposite to the lower surface 131c1, and four lateral surfaces 131c3 each located between the lower surface 131c1 and the upper surface 131c2.

The first electrode 131a and the second electrode 131b are separated from each other on the lower surface 131c1 of the semiconductor structure 131c. The first electrode 131a and the second electrode 131b can employ a metal such as gold (Au). The shape of the first electrode 131a and the second electrode 131b is rectangular in a plan view. Alternatively, the shape of the first electrode 131a and the second electrode 131b in a plan view may be other polygonal shapes such as triangular shape, or other shapes such as a polygon with rounded corners.

Because the first electrode 131a and the second electrode 131b are disposed on the lower surface 131c1 of the semiconductor structure 131c, the light emitted from the active layer of the semiconductor structure 131c is reflected by the lower surface 131c1 and exits mainly from the upper surface 131c2. Hereinafter, the upper surface 131c2 is also referred to as a "light-emitting surface 131c2" of the light-emitting element 131. Also, the surface of the light-emitting element 131 opposite to the light-emitting surface 131c2 and on which the first electrode 131a and the second electrode 131b are disposed, that is, the lower surface 131c1 of the semiconductor structure 131c, is also referred to as an "electrode surface 131s1" of the light-emitting element 131.

The first covering layer 132a includes a first portion 132a1 that covers a region around the first electrode 131a of the electrode surface 131s1, and a second portion 132a2 that covers the lateral surfaces 131c3 continuously from the first portion 132a1. Specifically, as illustrated in FIG. 2, the first portion 132a1 has a frame shape surrounding the first electrode 131a in a plan view. In the present embodiment, the first portion 132a1 is in contact with the lateral surfaces of the first electrode 131a; substantially the entire region of the lower surface of the first electrode 131a is exposed from the first portion 132a1, as illustrated in FIG. 1B. As illustrated in FIGS. 1B and 2, the second portion 132a2 covers a lower portion of the lateral surfaces 131c3 located furthest in the −X direction, a portion of the lower portion of the lateral surfaces 131c3 located furthest in the +Y-direction, and a portion of the lower portion of the lateral surfaces 131c3 located furthest in the −Y-direction.

The second covering layer 132b includes a first portion 132b1 that covers a region around the second covering layer 132b of the electrode surface 131s1, and a second portion 132b2 that covers the lateral surfaces 131c3 continuously from the first portion 132b1. Specifically, the first portion 132b1 has a frame shape surrounding the second electrode 131b in a plan view. In the present embodiment, as illustrated in FIG. 1B, the first portion 132b1 is in contact with the lateral surfaces of the second electrode 131b; substantially the entire region of the lower surface of the second electrode 131b is exposed from the first portion 132b1. As illustrated in FIGS. 1B and 2, the second portion 132b2 covers a lower portion of the lateral surfaces 131c3 located furthest in the +X-direction, another portion of the lower portion of the lateral surfaces 131c3 located furthest in the +Y-direction, and another portion of the lower portion of the lateral surfaces 131c3 located furthest in the −Y-direction. In the present embodiment, the first covering layer 132a and the second covering layer 132b are separated from each other.

The covering layers need to cover at least the region surrounding the electrode on the electrode surface, but the region where the covering layer is disposed is not limited to the above. For example, the covering layer may cover only a region surrounding the electrode at the electrode surface, and need not cover the lateral surfaces of the light-emitting element. Alternatively, for example, each covering layer may cover the upper portion as well as the lower portion of the lateral surfaces of the light-emitting element. Alternatively, for example, in some embodiment, the covering layer is not in contact with the electrode, and is in contact with the lateral surfaces and the lower surface of the electrode.

As illustrated in FIG. 1B, a maximum thickness t2 of the first covering layer 132a is greater than a maximum thickness t1 of the first electrode 131a. For example, the maximum thickness t2 is preferably in a range from 0.5 μm to 1.0 μm, and in a range from 1.1 times to 2.0 times the maximum thickness t1. Similarly, a maximum thickness t4 of the second covering layer 132b is greater than a maximum thickness t3 of the second electrode 131b. For example, the maximum thickness t4 is preferably in a range from 0.5 μm to 1.0 μm, and in a range from 1.1 times to 2.0 times the maximum thickness t3. However, the size relationship between the maximum thickness of the covering layer and the maximum thickness of the electrode is not limited to the above. For example, in some embodiments, the maximum thickness of the covering layer does not exceed the maximum thickness of the electrode.

The first covering layer 132a and the second covering layer 132b preferably employ, for example, a material which is resistant to a plating liquid used in forming the first and second bonding members 141 and 142 which will be described later. Examples of such a material include metals such as titanium (Ti), copper (Cu), aluminum (Al), or the like, oxides such as aluminum oxide ($Al_2O_3$), silicon oxide ($SiO_2$), or the like, and a resist or the like. The first covering layer 132a and the second covering layer 132b may employ the same type of metal as the metal constituting the first bonding member 141 and the second bonding member 142. In such a case, in removing the first covering layer 132a and the second covering layer 132b by etching or the like, which will be described later, the density of the first and second covering layers 132a and 132b may be lower than the density of the first and second bonding members 141 and 142, for example, to promote etching of the first and second covering layers 132a and 132b while suppressing etching of the first and second bonding members 141 and 142. The first covering layer 132a and the second covering layer 132b can employ the same type of resist as used in the resist layer 120.

The intermediate body 130 is disposed on the resist layer 120 such that the first electrode 131a faces the first metal layer 112a and the second electrode 131b faces the second metal layer 112b, as illustrated in FIG. 1B. In the present embodiment, the upper end portion of the resist layer 120 is in contact with the semiconductor structure 131c, and is positioned between the first covering layer 132a and the second covering layer 132b in a plan view.

In a case in which the plurality of light-emitting elements 131 is mounted on the wiring substrate 110, the plurality of intermediate bodies are disposed in accordance with the arrangement pattern of the plurality of light-emitting elements. In that case, the resist layer is formed in accordance with the arrangement pattern of the plurality of intermediate bodies.

Subsequently, as illustrated in FIG. 3A, the first bonding member 141 and the second bonding member 142 are formed by plating. The first bonding member 141 and the second bonding member 142 preferably have a light reflectivity. The first bonding member 141 and the second bonding member 142 can employ, for example, at least one type of metal selected from copper (Cu), tungsten (W), nickel (Ni), silver (Ag), gold (Au), palladium (Pd), platinum (Pt), or the like, or an alloy including one or more types of these metals, and in particular, copper is preferably used in terms of heat dissipation.

For example, the first bonding member 141 and the second bonding member 142 are formed by electrolytic plating, a type of wet plating. Specifically, the wiring substrate 110 on which the resist layer 120 and the intermediate body 130 are disposed, and the metal electrode serving as a source of the metal constituting the bonding members 141 and 142 are immersed in the plating solution. Then, a voltage is applied between the metal electrode and the metal layers 112a and 112b. Thus, the first bonding member 141 is grown starting from the first metal layer 112a, and the second bonding member 142 is grown starting from the second metal layer 112b.

The first bonding member 141 is grown in a direction from the first metal layer 112a toward the first electrode 131a, that is, in the Z-direction. The first bonding member 141 is also grown in a direction intersecting the direction from the first metal layer 112a toward the first electrode 131a, that is, in the direction intersecting the Z-direction such as the direction along the X-Y plane. Accordingly, the first bonding member 141 which is in contact with the first electrode 131a and the first and second portions 132a1 and 132a2 of the first covering layer 132a is formed. Similarly, the second bonding member 142 is grown in a direction from the second metal layer 112b toward the second electrode 131b and also in a direction intersecting thereto. Accordingly, the second bonding member 142 which is in contact with the second electrode 131b and the first and second portions 132b1 and 132b2 of the second covering layer 132b is formed. At this time, the first bonding member 141 and the second bonding member 142 may each be in contact with the resist layer 120.

The first bonding member 141 formed in this manner includes a base portion 141a located between the first metal layer 112a and the first electrode 131a, and an extending portion 141b that extends upward from the base portion 141a and faces the lateral surfaces 131c3 of the light-emitting element 131 via the second portion 132a2 of the first covering layer 132a. Specifically, the extending portion 141b faces, via the second portion 132a2, the lateral surfaces 131c3 located on the side furthest in the −X-direction, the lateral surfaces 131c3 located on the side furthest in the +Y-direction, and the lateral surfaces 131c3 located on the side furthest in the −Y-direction. Similarly, the second bonding member 142 includes a base portion 142a located between the second metal layer 112b and the second electrode 131b, and an extending portion 142b that extends upward from the base portion 142a and faces the lateral surfaces 131c3 of the light-emitting element 131 via the second portion 132b2 of the second covering layer 132b. Specifically, the extending portion 142b faces, via the second portion 132b2, the lateral surfaces 131c3 located on the side furthest in the +X direction, the lateral surfaces 131c3 located on the side furthest in the +Y direction, and the lateral surfaces 131c3 located on the side furthest in the −Y direction.

The method for forming the first bonding member and the second bonding member is not limited to the above. For example, the first bonding member may only include the base portion, and the second bonding member may only include the base portion.

Subsequently, the resist layer 120 is removed as illustrated in FIG. 3B. For example, the resist layer 120 is removed by immersing the wiring substrate 110 on which the resist layer 120, the intermediate body 130, and the first and second bonding members 141 and 142 are formed in a stripping solution.

Subsequently, as illustrated in FIG. 4A, the first covering layer 132a and the second covering layer 132b are removed. The first covering layer 132a and the second covering layer 132b are removed by etching, for example. Accordingly, a gap S1 is generated between the electrode surface 131s1 of the light-emitting element 131 and the first bonding member 141, and a gap S2 is generated between the lateral surfaces 131c3 of the light-emitting element 131 and the first bonding member 141. Similarly, a gap S3 is generated between the electrode surface 131s1 of the light-emitting element 131 and the second bonding member 142, and a gap S4 is generated between the lateral surfaces 131c3 of the light-emitting element 131 and the second bonding member 142.

The order of removing the resist layer and the covering layers is not limited to the above order. For example, in a case in which each covering layer is made of the resist, the covering layer and the resist layer may be removed simultaneously. Alternatively, the resist layer may be removed after removing each covering layer.

Subsequently, the first plating layer 150a is formed on the surface of the first bonding member 141 and the second plating layer 150b is formed on the surface of the second bonding member 142 by plating, as illustrated in FIG. 4B. Preferably, at least surfaces facing the light-emitting element 131 of the first plating layer 150a and the second plating layer 150b have light reflectivity.

Figure 7:
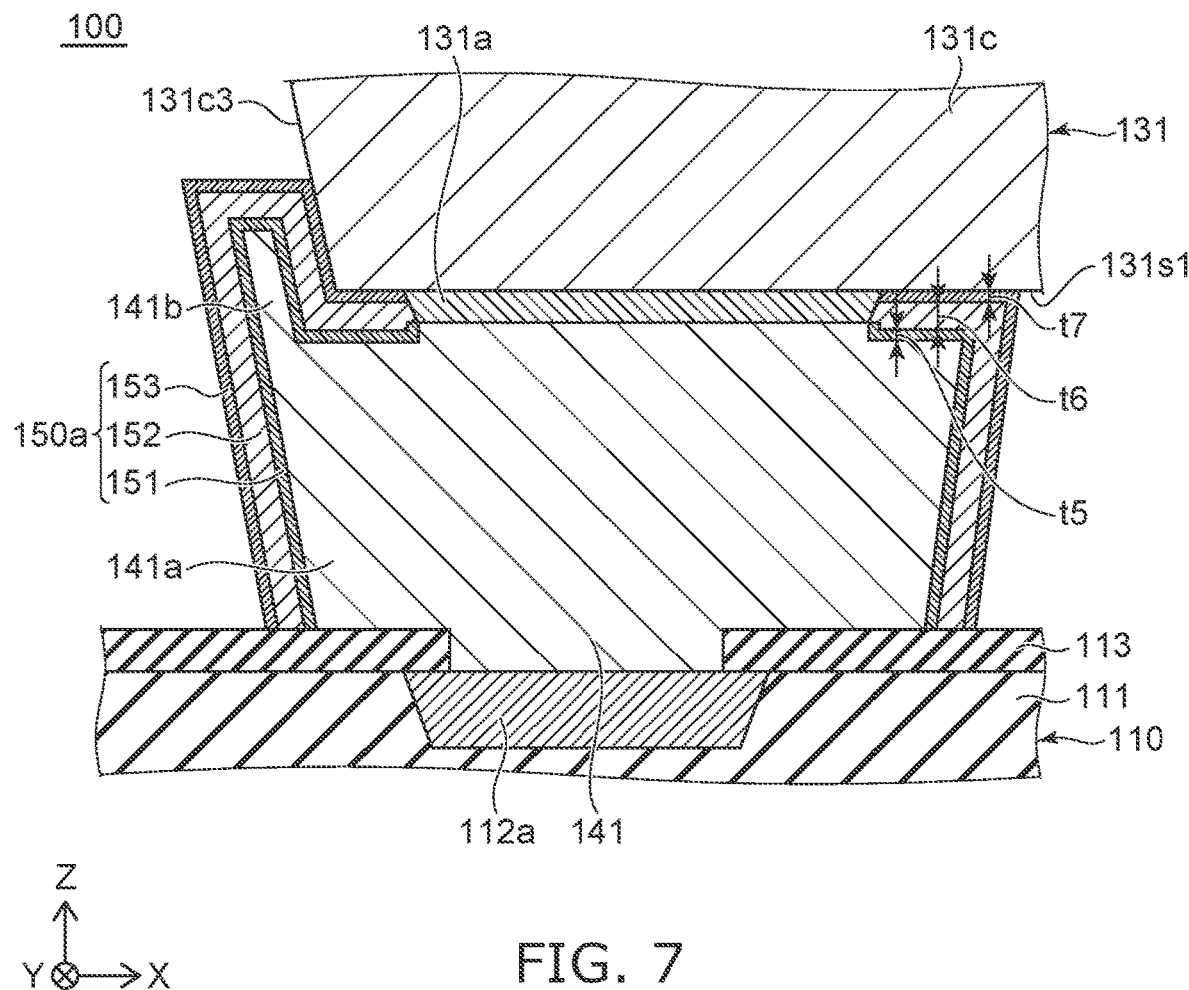
FIG. 7 is a cross-sectional view illustrating the method for manufacturing the light-emitting module according to the first embodiment.

As illustrated in FIG. 7, the first plating layer 150a includes a first layer 151, a second layer 152, and a third layer 153. A method for forming the first plating layer 150a is described in detail below. Like the first plating layer 150a, a second plating layer 150b includes the first layer 151, the second layer 152, and the third layer 153, and is formed similarly to the first plating layer 150a, so that the description of a method for forming the second plating layer 150b will be omitted.

Figure 5:
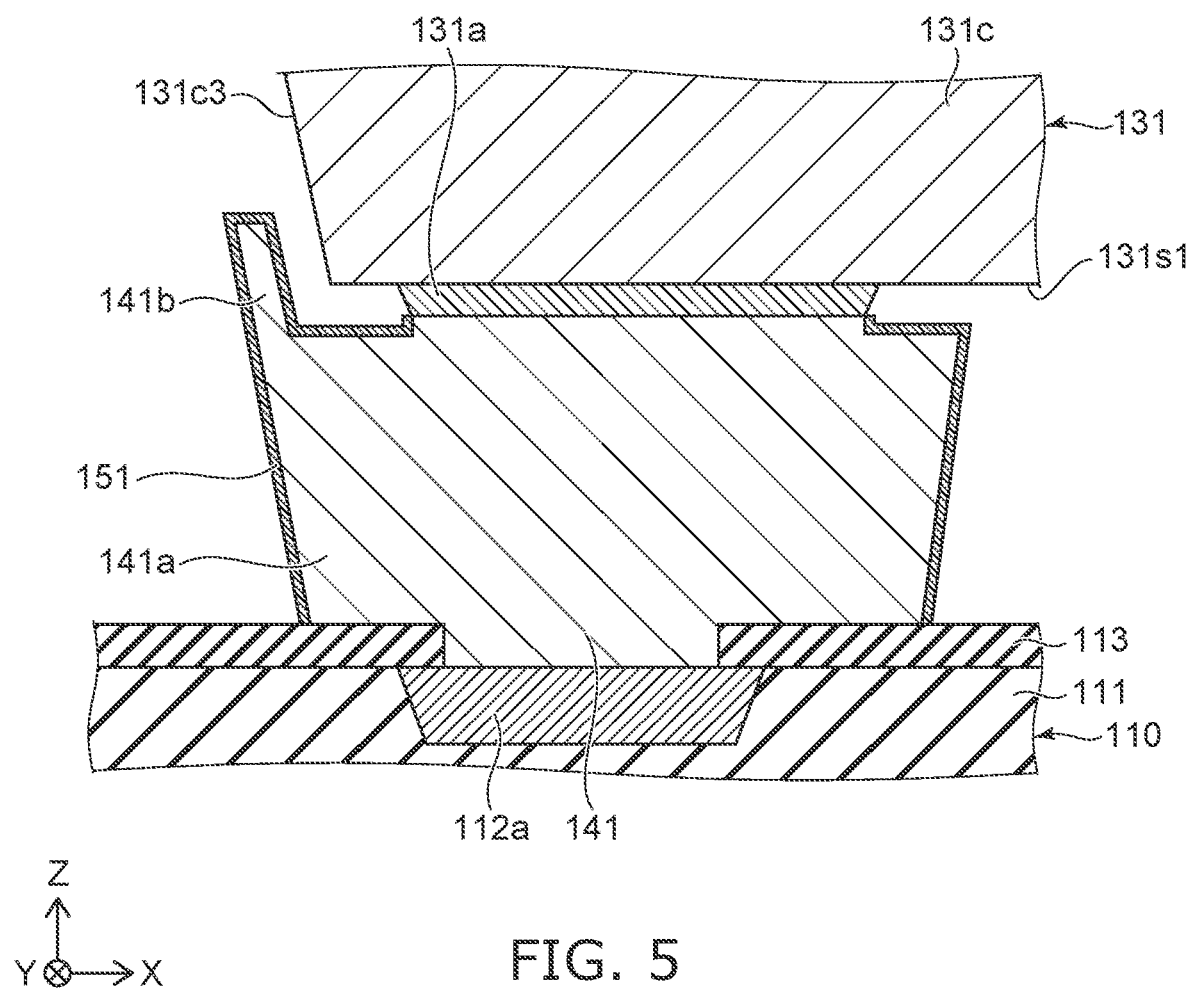
FIG. 5 is a cross-sectional view illustrating the method for manufacturing the light-emitting module according to the first embodiment.

First, as illustrated in FIG. 5, the first layer 151 is formed by electroless plating on the surface of the first bonding member 141. For example, the first layer 151 can employ a metal such as gold (Au) that can function as a catalyst when the second layer 152 is being formed. This facilitates the formation of the second layer 152, which will be described below, on the first layer 151. At this time, the first layer 151 is formed by adjusting the time for performing the electroless plating so as to leave the gap between the first layer 151 and the electrode surface 131s1 and between the first layer 151 and the lateral surfaces 131c3. For example, the time for performing the electroless plating is preferably set to a range from 1 minute to less than 10 minutes. The first layer 151 covers substantially the entire region exposed from the wiring substrate 110 and the light-emitting element 131 of the surface of the first bonding member 141.

Figure 6:
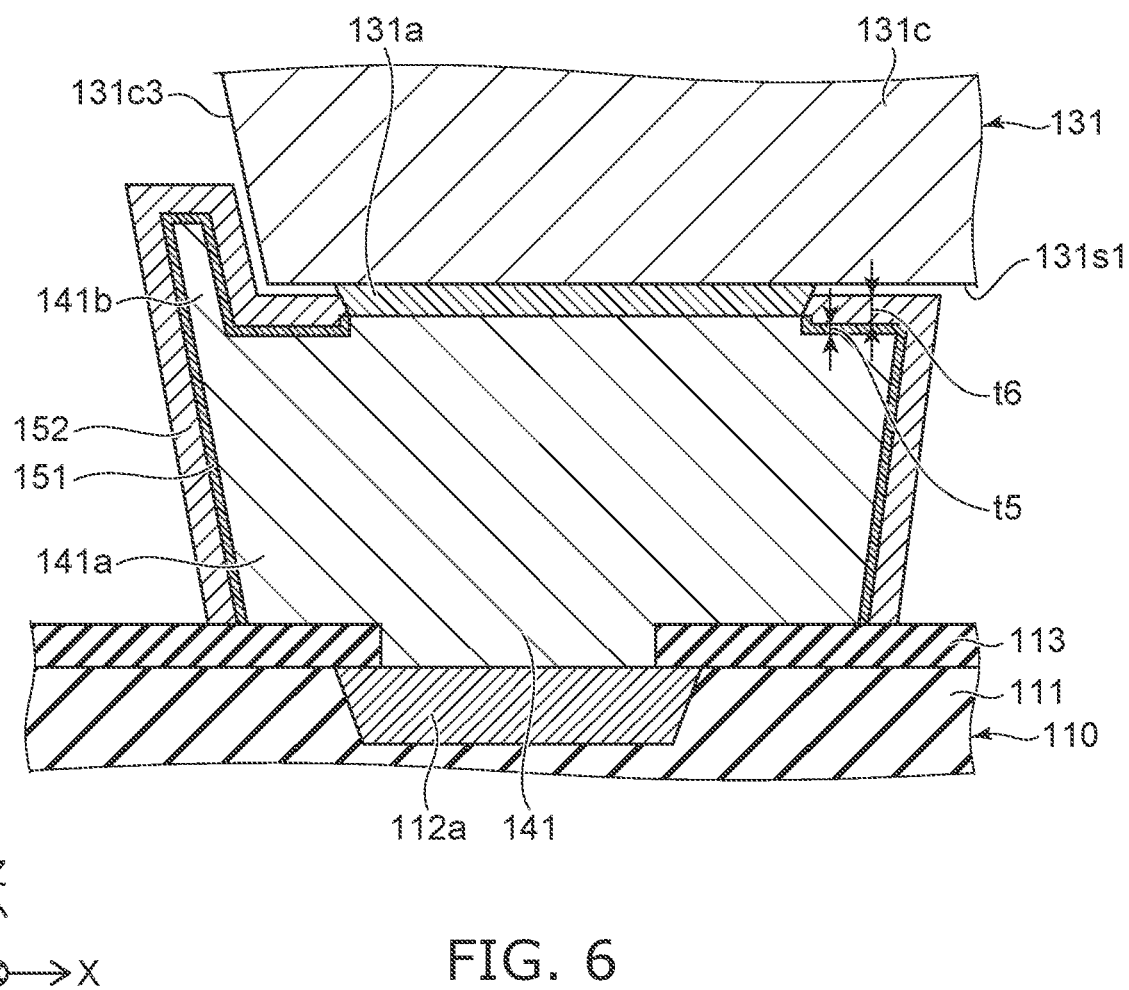
FIG. 6 is a cross-sectional view illustrating the method for manufacturing the light-emitting module according to the first embodiment.

Subsequently, as illustrated in FIG. 6, the second layer 152 is formed on the surface of the first layer 151 by the electroless plating. The second layer 152 can employ at least one type of metal selected from, for example, palladium (Pd), rhodium (Rh), platinum (Pt), ruthenium (Ru), iridium (Ir), or the like, or an alloy including one or more types of these metals. This preferably can suppress corrosion of the first bonding member 141. At this time, the second layer 152 is formed so as to leave the gap between the second layer 152 and the electrode surface 131s1 and between the second layer 152 and the lateral surfaces 131c3. The second layer 152 covers substantially the entire region of the surface of the first layer 151. The second layer 152 is in contact with the lateral surfaces of the first electrode 131a.

The second layer 152 is formed by setting the time for performing the electroless plating longer than that for forming the first layer 151 so that a maximum thickness t6 of the second layer 152 is greater than a maximum thickness t5 of the first layer 151 between the first bonding member 141 and the electrode surface 131s1. Preferably, the time for performing the electroless plating is set, for example, to a range from 10 minutes to less than 60 minutes. For example, the maximum thickness t6 is preferably in a range from 0.1 μm to 0.5 μm, and in a range from 2 times to 100 times the maximum thickness t5. The time for performing the electroless plating is not limited to the above. The size relationship between the maximum thickness of the second layer and the maximum thickness of the first layer is not limited to the above. For example, in some embodiments, the maximum thickness of the second layer does not exceed the maximum thickness of the first layer.

Subsequently, as illustrated in FIG. 7, the third layer 153 is formed on the surface of the second layer 152 by electroless plating. The third layer 153 can employ the same type of metal as the metal used in the first layer 151 such as gold (Au), for example. Alternatively, the third layer 153 may employ the metal different from the metal used in the first layer 151. The third layer 153 covers substantially the entire region of the surface of the second layer 152. The third layer 153 is in contact with the electrode surface 131s1 and the lateral surfaces 131c3 of the light-emitting element 131.

The third layer 153 is formed such that a maximum thickness t7 is less than the maximum thickness t6 of the second layer 152 between the first bonding member 141 and the electrode surface 131s1. For example, the maximum thickness t7 is preferably in a range from 0.01 μm to 0.1 μm, and in a range from 0.02 times to less than 1.0 times the maximum thickness t6. Furthermore, the maximum thickness t7 is preferably in a range from 1.0 times to 2.0 times the maximum thickness t5. The maximum thickness t7 of the third layer 153 is, for example, substantially equal to the maximum thickness t5 of the first layer 151. The size relationship between the maximum thickness of the third layer and the maximum thickness of the second layer is not limited to the above. For example, the maximum thickness of the third layer may be greater than or equal to the maximum thickness of the second layer.

The structure and the method for manufacturing the first plating layer are not limited to the above. For example, the first plating layer may be a single layer, or may be multiple layers such as two layers or four or more layers.

Thus, the light-emitting module 100 is formed. As illustrated in FIG. 8, the light-emitting module 100 thus formed includes the wiring substrate 110, the light-emitting element 131, the first bonding member 141, the second bonding member 142, the first plating layer 150a, and the second plating layer 150b.

The first plating layer 150a is disposed between the base portion 141a of the first bonding member 141 and the electrode surface 131s1 of the light-emitting element 131, between the extending portion 141b of the first bonding member 141 and the lateral surfaces 131c3 of the light-emitting element 131, and on the lateral surfaces of the base portion 141a and the extending portion 141b of the first bonding member 141. Specifically, the first layer 151, the second layer 152, and the third layer 153 included in the first plating layer 150a are each disposed between the base portion 141a of the first bonding member 141 and the electrode surface 131s1 of the light-emitting element 131, and between the extending portion 141b of the first bonding member 141 and the lateral surfaces 131c3 of the light-emitting element 131. Similarly, the second plating layer 150b is disposed between the base portion 142a of the second bonding member 142 and the electrode surface 131s1 of the light-emitting element 131, between the extending portion 142b of the second bonding member 142 and the lateral surfaces 131c3 of the light-emitting element 131, and on the lateral surfaces of the base portion 142a of the second bonding member 142 and the extending portion 142b. Specifically, the first layer 151, the second layer 152, and the third layer 153 included in the second plating layer 150b are each disposed between the base portion 142a of the second bonding member 142 and the electrode surface 131s1 of the light-emitting element 131, and between the extending portion 142b of the second bonding member 142 and the lateral surfaces 131c3 of the light-emitting element 131.

In a case in which the first plating layer 150a and the second plating layer 150b have light reflectivity, a portion of light emitted from the active layer of the light-emitting element 131 is reflected by the first plating layer 150a disposed on the surface of the extending portion 141b and the second plating layer 150b disposed on the surface of the extending portion 142b, and travels toward the light-emitting surface 131c2 of the light-emitting element 131. This can improve the light extraction efficiency of the light-emitting module 100. Should the bonding member have light reflectivity, even when the plating layer is not disposed on the surface of the extending portion, the extending portion can reflect the portion of the light emitted from the light-emitting element toward the light-emitting surface of the light-emitting element. In such a case, the light extraction efficiency of the light-emitting module can also be improved.

A maximum width W1 of a bonded portion between the first bonding member 141 and the first electrode 131a is greater than a maximum width W2 of a bonded portion between the first bonding member 141 and the first metal layer 112a. The maximum width W1 is preferably in a range from 1.1 times to 3.0 times the maximum width W2. Similarly, a maximum width W3 of a bonded portion between the second bonding member 142 and the second electrode 131b is greater than a maximum width W4 of a bonded portion between the second bonding member 142 and the second metal layer 112b. The maximum width W3 is preferably in a range from 1.1 times to 3.0 times of the maximum width W4. However, the size relationship of the maximum widths is not limited to the above.

The structure of the light-emitting module is not limited to the above. For example, the light-emitting module may further include a light shielding member. The light-shielding member surrounds and covers the lateral surfaces of the light-emitting element. The light-shielding member may be disposed between the light-emitting element and the wiring substrate. Specifically, the light-shielding member may be disposed between adjacent bonding members. The light shielding member contains, for example, a resin member and a light reflective material disposed in the resin member. Examples of the usable resin member include a silicone resin, a modified silicone resin, an epoxy resin, a modified epoxy resin, an acrylic resin, or a hybrid resin containing at least one type of these resins. Examples of the usable light reflective material include titanium oxide, aluminum oxide, zinc oxide, barium carbonate, barium sulfate, boron nitride, aluminum nitride, or a glass filler.

The light-emitting module may further include a wavelength conversion member, for example. The light-transmissive member is disposed, for example, on the light-emitting element. The wavelength conversion member includes a wavelength conversion substance that absorbs at least a portion of the light emitted from the light-emitting element, and emits light having a wavelength different from that of the light emitted from the light-emitting element. Examples of the usable wavelength conversion substance include YAG phosphors that emits yellowish light (for example, (Y,Lu,Gd)$_3$(Al,Ga)$_5$O$_{12}$:Ce), β-sialon phosphors that emit greenish light (for example, (Si,Al)$_3$(O,N)$_4$:Eu), fluoride phosphors that emit reddish light (for example, K$_2$(Si,Ti,Ge)F$_6$:Mn or K$_2$(Si,Al)F$_6$:Mn), and nitride phosphors (for example, (Sr, Ca) AlSiN$_3$:Eu). The wavelength conversion substance contained in the wavelength conversion member may be one type or multiple types of substance.

Next, an effect of the present embodiment will be described.

In the method for manufacturing the light-emitting module 100 according to the present embodiment, the wiring substrate 110 with the first metal layer 112a on the upper surface thereof is provided. The resist layer 120 is formed on the wiring substrate 110 so that the first metal layer 112a is exposed. The intermediate body 130 includes the light-emitting element 131 and the first covering layer 132a. The light emitting element 131 includes the light-emitting surface 131c2 and the electrode surface 131s1 located opposite to the light-emitting surface 131c2 and having the first electrode 131a disposed on a portion of the electrode surface 131s1. The first covering layer 132a covers a portion of the electrode surface 131s1 located around the first electrode 131a. The intermediate body 130 is disposed on the resist layer 120 in a manner that the first electrode 131a faces the first metal layer 112a. The first bonding member 141 which is in contact with the first electrode 131a and the first covering layer 132a is formed by growing the first bonding member 141 starting from the first metal layer 112a by plating. The resist layer 120 and the first covering layer 132a are removed. The first plating layer 150a is formed on the surface of the first bonding member 141 by plating. The first plating layer 150a is disposed between the electrode surface 131s1 of the light-emitting element 131 and the first bonding member 141. The first plating layer 150a covering the surface of the first bonding member 141 can suppress the corrosion of the first bonding member 141.

In particular, as a result of disposing the first covering layer 132a on the electrode surface 131s1, it is possible to ensure formation of the gap S1 in which the first plating layer 150a can be provided between the first bonding member 141 and the electrode surface 131s1. Providing the first plating layer 150a between the first bonding member 141 and the electrode surface 131s1 can suppress the corrosion of the portion of the first bonding member 141 bonded to the electrode surface 131s1 and the vicinity thereof. Thus, a highly reliable light-emitting module 100 can be provided.

In forming the first bonding member 141, the first bonding member 141 is grown in the direction from the first metal layer 112a toward the first electrode 131a and in the direction intersecting thereto. This can firmly bond the first bonding member 141 to the first electrode 131a.

The light-emitting element 131 includes the lateral surfaces 131c3 between the light-emitting surface 131c2 and the electrode surface 131s1. The first covering layer 132a includes the first portion 132a1 covering the electrode surface 131s1 and the second portion 132a2 covering the lateral surfaces 131c3 continuously from the first portion 132a1. In forming the first bonding member 141, the first bonding member 141 is formed to be in contact with the first portion 132a1 and the second portion 132a2 of the first covering layer 132a. Accordingly, the first bonding member 141 can be formed to include the extending portion 141b. This can lead to the increase of the surface area of the first bonding member 141. As a result, the heat generated in the light-emitting element 131 can be efficiently dissipated to the outside by the first bonding member 141. Furthermore, the first plating layer 150a is disposed on the surface of the extending portion 141b of the first bonding member 141, and in the case in which the first plating layer 150a has light reflectivity, the first plating layer 150a can reflect the light emitted from the light-emitting element 131 toward the light-emitting surface 131c2. Should the first bonding member 141 have light reflectivity, even when the first plating layer 150a is not provided on the surface of the extending portion 141b, the extending portion 141b can reflect the light emitted from the light-emitting element 131 toward the light-emitting surface 131c2. This can improve the light extraction efficiency of the light-emitting module 100.

The maximum thickness t2 of the first covering layer 132a is greater than the maximum thickness t1 of the first electrode 131a. Thus, the first plating layer 150a can be easily formed in the gap S1, which is formed by removing the first covering layer 132a, between the electrode surface 131s1 of the light-emitting element 131 and the first bonding member 141.

The first plating layer 150a contains at least one type of metal selected from palladium, rhodium, platinum, ruthenium, or iridium, or an alloy of these metals. This can preferably suppress the corrosion of the first bonding member 141.

The first bonding member 141 contains copper. This allows the heat generated in the light-emitting element 131 to be efficiently dissipated to the outside by the first bonding member 141.

The first bonding member 141 is formed by wet plating, and the first covering layer 132a has resistance to the plating liquid. This can suppress the dissolution of the first covering layer 132a in the plating solution in forming the first bonding member 141.

The light-emitting module 100 according to the present embodiment includes the wiring substrate 110, the light-emitting element 131, the first bonding member 141, and the first plating member 150a. The wiring substrate 110 has the first metal layer 112a on the upper surface. The light-emitting element 131 has the light-emitting surface 131c2, the electrode surface 131s1 that is located opposite to the light-emitting surface 131c2 and includes the first electrode 131a disposed thereon, and the lateral surfaces 131c3 located between the light-emitting surface 131c2 and the electrode surface 131s1. The light-emitting element 131 is disposed above the wiring substrate 110 so that the first electrode 131a faces the first metal layer 112a. The first bonding member 141 bonds the first metal layer 112a and the first electrode 131a. The first plating layer 150a covers the surfaces of the first bonding member 141. The first bonding member 141 includes the base portion 141a located between the first metal layer 112a and the first electrode 131a, and the extending portion 141b extending upward from the base portion 141a and is separated from and faces the lateral surfaces 131c3. The first plating layer 150a is disposed between the extending portion 141b and the lateral surfaces 131c3. This can suppress the corrosion of the first bonding member 141. Thus, a highly reliable light-emitting module 100 can be provided. Furthermore, the first bonding member 141 including the extending portion 141b can efficiently dissipate the heat generated in the light-emitting element 131 to the outside by the first bonding member 141. The extending portion 141b of the first bonding member 141 can reflect the light emitted from the light-emitting element 131 toward the light-emitting surface 131c2. This can improve the light extraction efficiency of the light-emitting module 100.

The maximum width W1 of the bonded portion between the first bonding member 141 and the first electrode 131a is greater than the maximum width W2 of the bonded portion between the first bonding member 141 and the first metal layer 112a. This firmly bonds the first bonding member 141 to the first electrode 131a. The heat generated in the light-emitting element 131 can be efficiently dissipated to the outside by the first bonding member 141.

Second Embodiment

Next, a second embodiment will be described.

Figure 9:
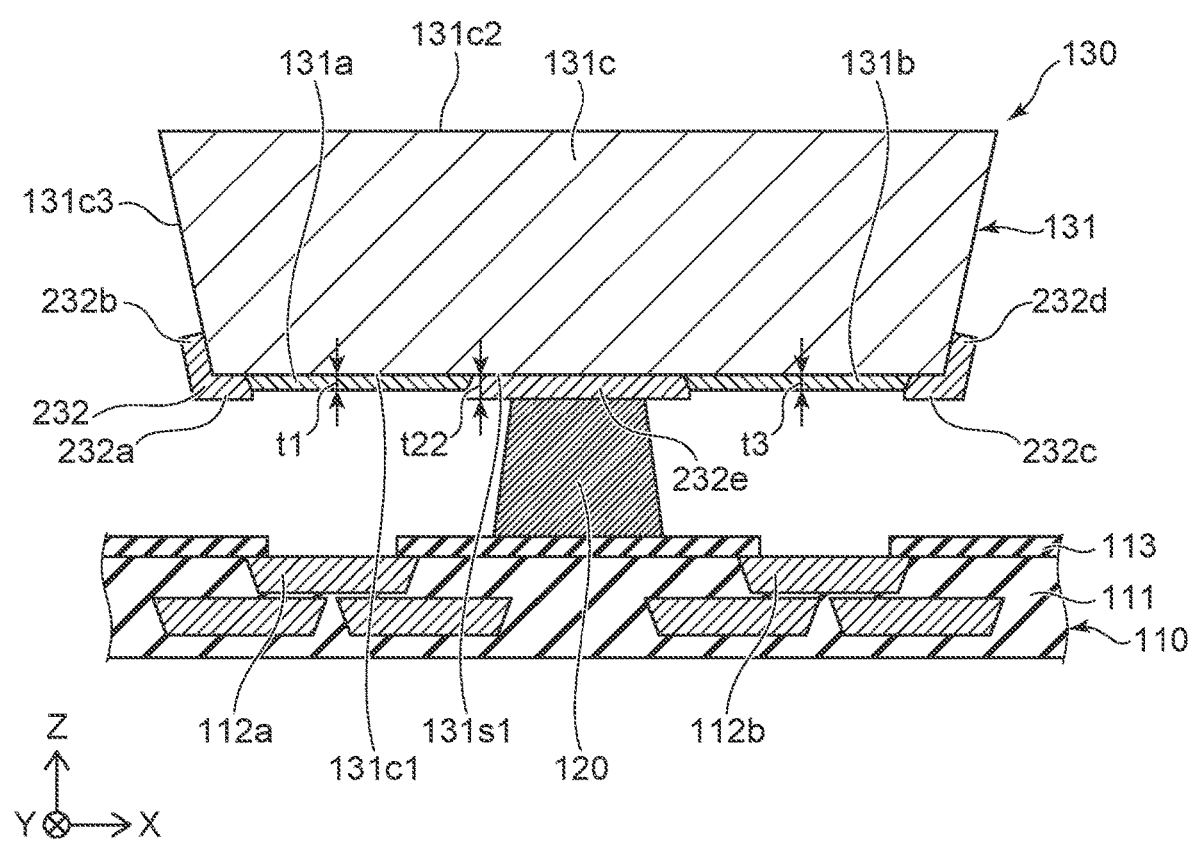
FIG. 9 is a cross-sectional view illustrating a method for manufacturing a light-emitting module according to a second embodiment.

FIG. 9 is a cross-sectional view illustrating a method for manufacturing a light-emitting module according to the present embodiment.

Figure 10:
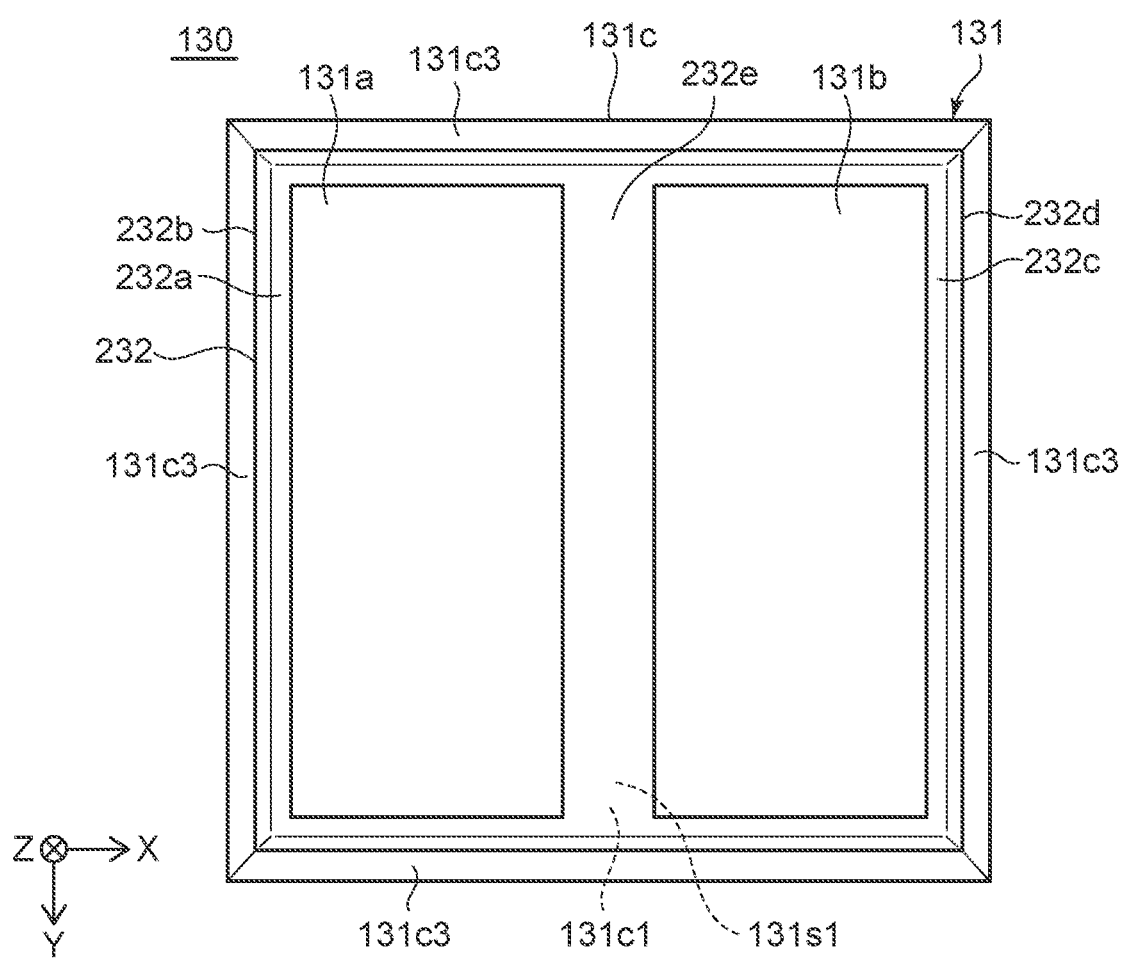
FIG. 10 is a bottom view of an intermediate body illustrated in FIG. 9.

FIG. 10 is a bottom view of an intermediate body illustrated in FIG. 9.

The method for manufacturing a light-emitting module 100 according to the present embodiment differs from the method for manufacturing the light-emitting module 100 according to the first embodiment in that one covering layer 232 covers both a portion located around the first electrode 131a and a portion located around the second electrode 131b of the electrode surface 131s1.

In the following description, what differs from the first embodiment is mainly described. Except for the matters described below, the present embodiment can be provided similarly to the first embodiment. The same applies to other embodiments described later as well.

The covering layer 232 includes a first portion 232a covering a region around the first electrode 131a of the electrode surface 131s1, a second portion 232b covering the lateral surfaces 131c3 continuously from the first portion 232a, a third portion 232c covering a region around the second electrode 131b of the electrode surface 131s1, a fourth portion 232d covering the lateral surfaces 131c3 continuously from the third portion 232c, and a fifth portion 232e located between and continuing from the first portion 232a and the third portion 232c. A maximum thickness t22 of the covering layer 232 is greater than the maximum thickness t1 of the first electrode 131a and the maximum thickness t3 of the second electrode 131b. For example, the maximum thickness t22 is preferably in a range from 0.5 μm to 1.0 μm, and in a range from 1.1 times to 2.0 times the maximum thickness t1 or the maximum thickness t3. Alternatively, in some embodiments, the maximum thickness of the covering layer does not exceed the maximum thickness of any of the electrodes. The covering layer 232 can employ a material that is the same as or similar to that of the first and second covering layers 132a and 132b of the first embodiment.

The intermediate body 130 is disposed on the resist layer 120 such that, for example, the resist layer 120 is in contact with the fifth portion 232e of the covering layer 232. Accordingly, in the present embodiment, the bonding member can be grown without being in contact with the electrode surface 131s1 located between the first electrode 131a and the second electrode 131b, thus facilitating bonding between the first electrode 131a and the metal layer 112a and between the second electrode 131b and the metal layer 112b.

Third Embodiment

Next, a third embodiment will be described.

Figure 11:
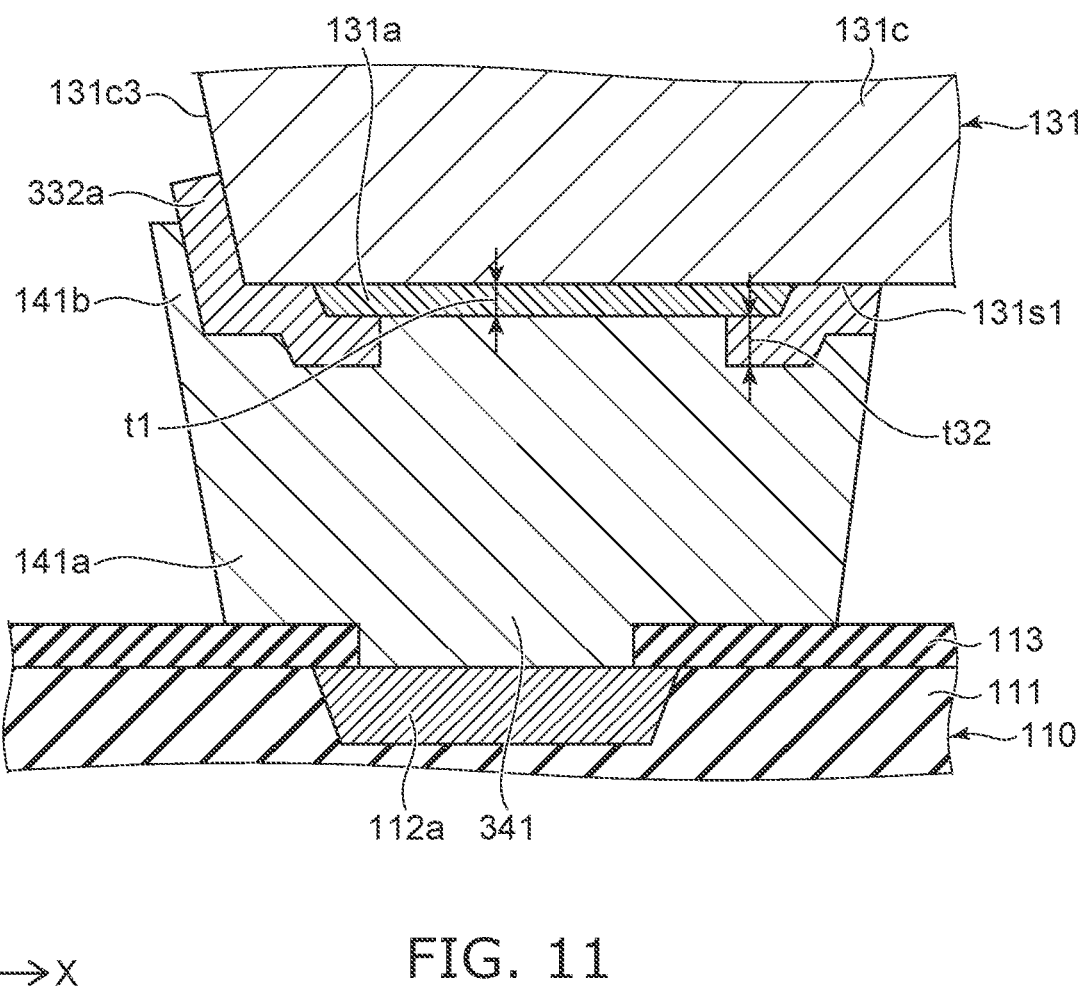
FIG. 11 is a cross-sectional view illustrating a method for manufacturing a light-emitting module according to a third embodiment.
Figure 12:
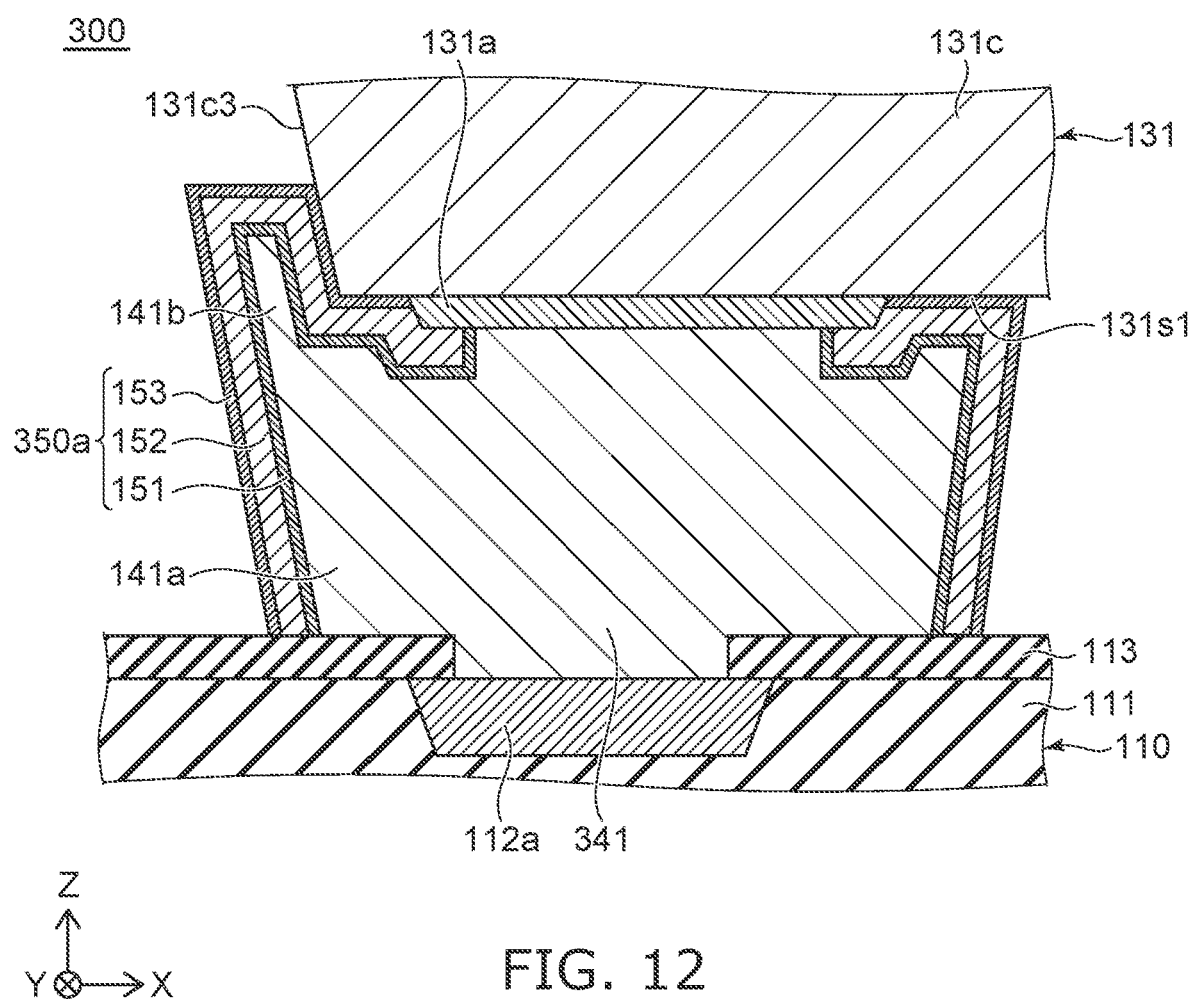
FIG. 12 is a cross-sectional view illustrating the method for manufacturing the light-emitting module according to the third embodiment.

FIGS. 11 and 12 are cross-sectional views illustrating a method for manufacturing a light-emitting module according to the present embodiment.

The method for manufacturing a light-emitting module 300 according to the present embodiment differs from the method for manufacturing the light-emitting module 100 according to the first embodiment in that a first covering layer 332a covers a portion of the lower surface of the first electrode 131a.

As illustrated in FIG. 11, the first covering layer 332a covers a portion around the first electrode 131a of the electrode surface 131s1 of the light-emitting element 131 and the lateral surfaces 131c3 of the light-emitting element 131, and further covers the entire circumference of the outer periphery of the lower surface of the first electrode 131a. For example, a width of the outer peripheral portion covered with the first covering layer 332a is preferably in a range from 1.0 μm to 4.0 μm.

Alternatively, the first covering layer may partially cover the outer peripheral portion of the lower surface of the first electrode. A maximum thickness t32 of the first covering layer 332a is greater than the maximum thickness t1 of the first electrode 131a. For example, the maximum thickness t32 is preferably in a range from 0.5 μm to 1.0 μm, and in a range from 1.1 times to 2.0 times the maximum thickness t1. Alternatively, in some embodiments, the maximum thickness of the covering layer does not exceed the maximum thickness of the first electrode. The first covering layer 332a can employ a material that is the same as or similar to that of the first covering layer 132a and the second covering layer 132b illustrated in the first embodiment.

When a first bonding member 341 is formed with the first covering layer 332a disposed on the light-emitting element 131, a first bonding member 341 is separated from the outer peripheral portion of the lower surface of the first electrode 131*a*.

Therefore, when a first plating layer 350*a* is formed, as illustrated in FIG. 12, after the first covering layer 332*a* is removed and the first bonding member 341 is formed, the first plating layer 350*a* is also provided between the lower surface of the first electrode 131*a* and the first bonding member 341. The second covering layer, the second bonding member, and the second plating layer can be provided and formed similarly to the first covering layer 332*a*, the first bonding member 341, and the first plating layer 350*a*, respectively.

Next, an effect of the present embodiment is described.

In the method for manufacturing the light-emitting module 300 according to the present embodiment, the first covering layer 332*a* covers a portion of the lower surface of the first electrode 131*a*. Thus, the first plating layer 350*a* covers the portion of the lower surface of the first electrode 131*a*. This allows the first plating layer 350*a* to more reliably cover the bonded portion between the first bonding member 341 and the first electrode 131*a*. This can preferably suppress the corrosion of the first bonding member 341.

The above-described embodiments have been presented by way of example embodying the present invention, and are not intended to limit the scope of the present invention. For example, the addition, deletion or modification of several components or steps in the above-described embodiments are also included in the present invention. Each structure and each method in the plurality of embodiments can be combined as appropriate to the extent without contradiction with the scope of the invention.

What is claimed is:

1. A method for manufacturing a light-emitting module, the method comprising: providing a wiring substrate comprising:
   a base member having an upper surface, and
   a metal layer disposed on the upper surface of the base member;
   forming a resist layer on the wiring substrate such that the metal layer is exposed from the resist layer;
   disposing an intermediate body on the resist layer, the intermediate body comprising a light-emitting element and a covering layer, wherein:
   the light-emitting element has a light-emitting surface, and an electrode surface located opposite to the light-emitting surface,
   the light-emitting element comprises an electrode disposed on a portion of the electrode surface,
   the covering layer covers a portion of the electrode surface located around the electrode, and
   the electrode faces the metal layer;
   forming a bonding member by plating, which comprises growing the bonding member starting from the metal layer such that the bonding member is in contact with the electrode and the covering layer;
   removing the resist layer and the covering layer; and
   forming a plating layer on a surface of the bonding member by plating, such that a portion of the plating layer is located between the electrode surface of the light-emitting element and the bonding member.

2. The method according to claim 1, wherein:
in the step of forming the bonding member, the bonding member is grown in a first direction from the metal layer toward the electrode and in a second direction intersecting the first direction.

3. The method according to claim 1, wherein:
the light-emitting element has a lateral surface located between the light-emitting surface and the electrode surface;
the covering layer comprises a first portion covering the electrode surface, and a second portion covering the lateral surface continuously from the first portion, and
in the step of forming the bonding member, the bonding member is formed in contact with the first portion and the second portion of the covering layer.

4. The method according to claim 1, wherein:
the covering layer covers a portion of the lower surface of the electrode.

5. The method according claim 1, wherein:
a maximum thickness of the covering layer is greater than a maximum thickness of the electrode.

6. The method according to claim 1, wherein:
the plating layer includes at least one type of metal selected from palladium, rhodium, platinum, ruthenium, or iridium, or an alloy of these metals.

7. The method according to claim 1, wherein:
the bonding member contains copper.

8. The method according to claim 1, wherein:
the bonding member is formed by wet plating; and
the covering layer has resistance to a plating liquid used in the wet plating.

9. The method according to claim 8, wherein:
the covering layer contains a metal, an oxide, or a resist.

10. The method according to claim 1, wherein:
the bonding member is formed by electrolytic plating.

11. The method according to claim 1, wherein:
the plating layer is formed by electroless plating.

* * * * *